United States Patent
Too et al.

(10) Patent No.: US 12,127,334 B2
(45) Date of Patent: Oct. 22, 2024

(54) MAINTAINING THE SHAPE OF A CIRCUIT BOARD

(71) Applicant: Teradyne, Inc., North Reading, MA (US)

(72) Inventors: Heng-Kit Too, Oak Park, CA (US); Xue-Bin Tan, Shanghai (CN); Max Zhang, Shanghai (CN); Rocky Tao, Shanghai (CN); Brian Brecht, Newbury Park, CA (US); Iris Weng, Shanghai (CN); Hale Deng, HeFei (CN)

(73) Assignee: Dis Tech America, LLC, North Reading, MA (US)

( * ) Notice: Subject to any disclaimer, the term of this patent is extended or adjusted under 35 U.S.C. 154(b) by 263 days.

(21) Appl. No.: 16/286,427

(22) Filed: Feb. 26, 2019

(65) Prior Publication Data
US 2020/0253041 A1    Aug. 6, 2020

(30) Foreign Application Priority Data

Feb. 1, 2019    (CN) .......................... 201910105514.6

(51) Int. Cl.
*B23K 1/00*    (2006.01)
*G01R 1/073*    (2006.01)
(Continued)

(52) U.S. Cl.
CPC ......... *H05K 1/0271* (2013.01); *B23K 1/0008* (2013.01); *G01R 1/07378* (2013.01);
(Continued)

(58) Field of Classification Search
CPC .......................... B23K 35/302; B23K 35/0244
See application file for complete search history.

(56) References Cited

U.S. PATENT DOCUMENTS

| 4,431,474 A | * | 2/1984 | Gronek ................ B23K 20/025 100/295 |
| 5,420,460 A | | 5/1995 | Massingill |

(Continued)

FOREIGN PATENT DOCUMENTS

| CN | 1182957 A | 7/1995 |
| CN | 1444273 A | 9/2003 |

(Continued)

OTHER PUBLICATIONS

Grid. In Cambridge English Dictionary. Retrieved Sep. 13, 2022, from https://dictionary.cambridge.org/dictionary/english/grid., (11 pages).

(Continued)

*Primary Examiner* — Erin B Saad
(74) *Attorney, Agent, or Firm* — ArentFox Schiff LLP (57) ABSTRACT

An example system for maintaining the shape of a circuit board includes metal balls that are configured not to collapse in whole or part in response to a force below a predefined force and a temperature below a predefined temperature. The metal balls are configured to support a substrate and are part of electrical connections between the substrate and a circuit board. The system includes a fixture configured to apply force to the substrate while the substrate is subjected to the temperature. The fixture is configured to distribute the force across a surface of the substrate that is not in contact with the metal balls such that the force applied by the fixture and the support of the substrate by the metal balls maintains a shape of the substrate at the temperature.

28 Claims, 4 Drawing Sheets

(51) Int. Cl.
*H05K 1/02* (2006.01)
*H05K 1/09* (2006.01)
*H05K 1/11* (2006.01)
*H05K 1/18* (2006.01)
*H05K 3/34* (2006.01)
*B23K 101/42* (2006.01)

(52) U.S. Cl.
CPC .............. *H05K 1/09* (2013.01); *H05K 1/11* (2013.01); *H05K 1/181* (2013.01); *H05K 3/3463* (2013.01); *B23K 2101/42* (2018.08); *H05K 2201/068* (2013.01); *H05K 2201/10378* (2013.01); *H05K 2201/10734* (2013.01); *H05K 2203/0195* (2013.01)

(56) References Cited

U.S. PATENT DOCUMENTS

| | | |
|---|---|---|
| 5,482,736 A | 1/1996 | Glenn et al. |
| 5,516,030 A | 5/1996 | Denton |
| 5,591,941 A | 1/1997 | Acocella et al. |
| 5,598,036 A | 1/1997 | Ho |
| 5,796,169 A | 8/1998 | Dockerty et al. |
| 5,796,589 A | 8/1998 | Barrow |
| 5,972,734 A | 10/1999 | Carichner et al. |
| 6,125,042 A | 9/2000 | Verdi et al. |
| 6,137,062 A | 10/2000 | Zimmerman |
| 6,539,618 B1 | 4/2003 | Lyke |
| 7,405,145 B2 | 7/2008 | Khan et al. |
| 9,060,424 B2 | 6/2015 | Shiu et al. |
| 9,668,358 B2 | 5/2017 | Kawasaki et al. |
| 2002/0139832 A1 | 10/2002 | Too |
| 2002/0171591 A1 | 11/2002 | Beard |
| 2004/0007384 A1 | 1/2004 | Soga et al. |
| 2004/0017672 A1 | 1/2004 | Matsuda |
| 2004/0060725 A1 | 4/2004 | Behziz et al. |
| 2006/0060636 A1 | 3/2006 | Daves et al. |
| 2007/0096755 A1 | 5/2007 | Parrish et al. |
| 2008/0035274 A1* | 2/2008 | Kanisawa ................. B30B 5/02 156/583.1 |
| 2008/0084675 A1 | 4/2008 | Amirali et al. |
| 2009/0261149 A1* | 10/2009 | Furuta .................... H01L 24/75 228/256 |
| 2013/0126591 A1* | 5/2013 | Jang ........................ H01L 24/95 228/180.1 |
| 2013/0133936 A1 | 5/2013 | Yorita et al. |
| 2015/0313025 A1* | 10/2015 | Kawasaki ............ H05K 3/3485 403/272 |
| 2018/0019193 A1 | 1/2018 | Liang et al. |

FOREIGN PATENT DOCUMENTS

| | | |
|---|---|---|
| CN | 104837579 A | 8/2015 |
| EP | 0690500 A1 | 1/1996 |
| JP | H07183652 A | 7/1995 |
| JP | H08017972 A | 1/1996 |
| JP | 2002314039 A | 10/2002 |

OTHER PUBLICATIONS

First Office Action in Chinese Application No. 201910105514.6 dated Mar. 28, 2024 [with English translation], 15 pages.

* cited by examiner

MAINTAINING THE SHAPE OF A CIRCUIT BOARD

CROSS-REFERENCE TO RELATED APPLICATION

This application claims priority to Chinese Patent Application No. 201910105514.6, which was filed on Feb. 1, 2019. The contents of Chinese Patent Application No. 201910105514.6 are incorporated herein by reference.

TECHNICAL FIELD

This specification describes example systems for maintaining the shape of a circuit board during environmental stress, such as heating.

BACKGROUND

A ball grid array (BGA) may be used to create an electrical connection between two circuit boards. For example, the BGA may include electrically-conductive balls that are used to create electrical connections to electrical contacts on one circuit board and to electrical contacts on another circuit board. Electrical signals may flow across these electrical connections between the two circuit boards.

SUMMARY

An example system for maintaining the shape of a circuit board includes metal balls that are configured not to collapse in whole or part in response to a force below a predefined force and a temperature below a predefined temperature. The metal balls are configured to support a substrate and are part of electrical connections between the substrate and a circuit board. The system includes a fixture configured to apply force to the substrate while the substrate is subjected to the temperature. The fixture is configured to distribute the force across a surface of the substrate that is not in contact with the metal balls such that the force applied by the fixture and the support of the substrate by the metal balls maintains a shape of the substrate at the temperature. The example system may include one or more of the following features either alone or in combination.

The predefined force may be seven Newtons or greater. The predefined temperature may include a temperature between 130° Celsius (C) and 250° C.

The metal balls may include copper. The metal balls may be pure copper. The metal balls may include a core that is pure copper. The metal balls may include lead and tin. The metal balls may include 90% lead and 10% tin. There may be between 3000 metal balls and 10,000 metal balls. There may be 20,000 or more metal balls. There may be 30,000 or more metal balls. Each of the metal balls may be on the order of tenths of a millimeter in diameter. Each of the metal balls may be 0.3 millimeters in diameter or less than 0.3 millimeters in diameter. The metal balls may be configured not to collapse at all in response to the force below the predefined force and the temperature below the predefined temperature.

The example system may include solder between at least some of the metal balls and conductive contacts on the circuit board. The solder may be part of the electrical connections between the substrate and a circuit board.

The substrate may include one or more components on a surface of the substrate. The fixture may include indentations that complement shapes of the components. The substrate may be or include an interposer configured to translate a first pitch of contacts to a second pitch of contacts. The second pitch may be greater than the first pitch. The substrate may be configured to connect electrically to a probe card configured to perform testing on dice on a wafer. The interposer may be configured to translate contacts at a first pitch on the probe card to contacts at a second pitch on the circuit board. Again, the second pitch may be greater than the first pitch.

The substrate may be flat in shape. Flatness may include a maximum deviation of no more than 0.0508 millimeters (2/1000 inches) in a first direction relative to a plane and in a second direction relative to the plane. The first direction may be different than the second direction. Flatness may include a maximum deviation of no more than 0.0762 millimeters (3/1000 inches) in a first direction relative to a plane and in a second direction relative to the plane. Again, the first direction being different than the second direction.

The system may include solder between at least some of the metal balls and conductive contacts on the circuit board. The solder may be part of the electrical connections between the substrate and a circuit board. The solder may include Sn63Pb37 and the at least some of the metal balls may include a core comprised of Sn63 and coated with Pb37; and the predefined temperature may be 215° Celsius. The solder may include SAC305 and the at least some of the metal balls may include a core coated with SAC305; and the predefined temperature may be 240° Celsius. The solder may include Sn63Pb37 and the at least some of the metal balls may include Sn10Pb90; and the predefined temperature may be 215° Celsius. The solder may include Sn42Bi58 and the at least some of the metal balls may include SAC305; and the predefined temperature may be 138° Celsius. The solder may include Sn42Bi58 and the at least some of the metal balls may include Sn63Pb37; and the predefined temperature may be 138° Celsius. The solder may include OM550 and the at least some of the metal balls may include SAC305; and the predefined temperature may be 200° Celsius. The solder may include Sn42Bi58 and the at least some of the metal balls may include SAC305; and the predefined temperature may be 141° Celsius.

Any two or more of the features described in this specification, including in this summary section, may be combined to form implementations not specifically described in this specification.

At least part of the systems described in this specification may be controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems described in this specification may be controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example systems for maintaining the shape of a circuit board during environmental stress, such as heating. The systems may be used, for example, when making electrical connections between two circuit boards using a ball grid array (BGA). In some cases, the BGA includes electrical contacts numbering in the thousands or tens-of-thousands. In an example, during solder reflow, which is the process of melting solder in the BGA to create electrical connections between a substrate and a printed circuit board (PCB), the substrate is susceptible to warping. Warping can affect the electrical connections created by the BGA, particularly at the edges of the substrate. For example, if the substrate warps, the substrate can peel away from the circuit board causing portions of the BGA also to peel away. As a result, the electrical connections in the warped areas break or do not to form at all. The example systems described herein may reduce the chances that the substrate will warp in the presence of heat such as the heat applied during solder reflow.

To this end, an example system includes metal balls that are configured to implement part of the electrical connections between two circuit boards, such as a substrate and a PCB. The system also includes a fixture that is configured to apply force to the substrate while the substrate is subjected to heating. The fixture is configured to distribute the force evenly across an entire surface of the substrate that is not in contact with the metal balls. The force applied by the fixture maintains a shape of the substrate even at the elevated temperature. For example, the fixture may be applied to keep the substrate flat or substantially flat during heating that may occur, for example, during a solder reflow cycle. In some implementations the flattening fixture may have a flat surface contacts the substrate. The metal balls are configured not to collapse in whole or in part in response to the force applied by the fixture at the elevated temperature. By using metal balls that are not collapsible in whole or in part, there is a reduced likelihood of adjacent metal balls contacting each other in response to the force and causing an electrical short between adjacent electrical connections.

Figure 1:
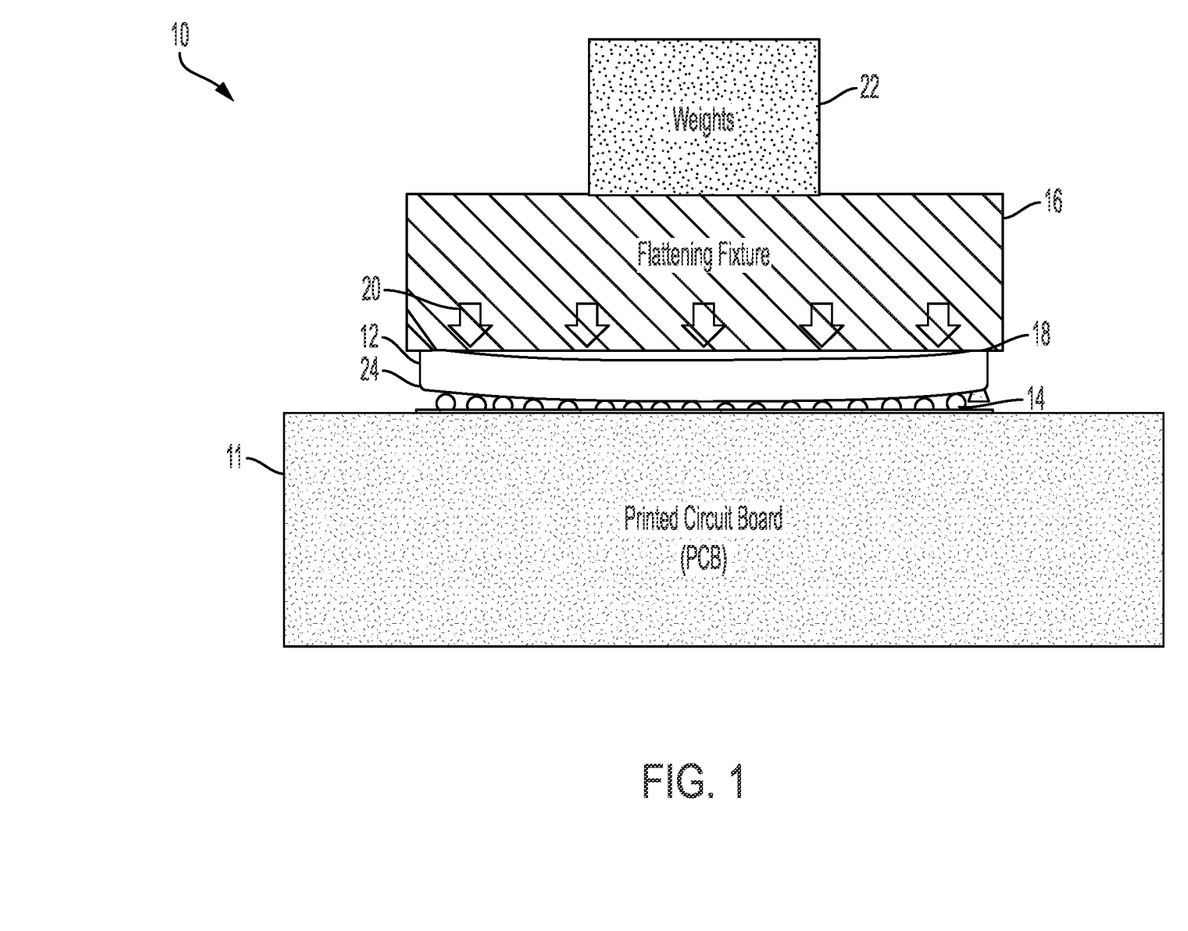
FIG. 1 is side view of a block diagram of an example system for maintaining the shape of a circuit board during environmental stress.

FIG. 1 shows an example system 10 of the type described in the preceding paragraphs. System 10 may be used to make any appropriate electrical connections between two circuit boards or other structures. In this example, system 10 is used in a process for electrically connecting a substrate and a PCB in a test system.

In this regard, system 10 includes PCB 11 and a substrate 12. PCB 11 is a circuit board in a test system, such as automatic test equipment (ATE). Substrate 12 is also a circuit board. In this example, substrate 12 is an interposer board that provides the electrical and mechanical interface between PCB 11 and a probe card (not shown) that connects to the substrate. Substrate 12 is configured to translate the pitch of electrical contacts on the PCB to the pitch of electrical contacts on the probe card. As described below, the electrical connections between PCB 11 and the interposer are formed using system 10 and then a probe card connects to the surface of the interposer. In some examples, PCB 11, the interposer, and the probe card are part of a test head that brings the probe card into contact with devices under test (DUTs) during testing. This configuration is described with respect to FIG. 3.

In some implementations, both substrate 12 and PCB 11 include FR4. FR4 includes a glass-reinforced epoxy laminate material. In this example, substrate 12 and PCB 11 include conductive traces, conductive vias, or both conductive traces and conductive vias. Electrical contacts connect electrically to the traces and/or vias. The electrical connections between substrate 12 and PCB 11 are implemented by connecting BGA 14 to the electrical contacts on the substrate and the PCB. Each electrical connection in the BGA may be implemented using solder and a metal ball. The solder melts to create an electrical connection to the metal ball. The metal ball and/or solder together create electrical connections to the electrical contacts on both the substrate and the PCB. Both the solder and the metal ball are electrically conductive, allowing electrical signals to pass between conductive traces or structures on the PCB and conductive traces or structures on the substrate.

Solder is a fusible metal alloy used to create a permanent electrical connection between the metal ball and electrical contacts on both the PCB and the substrate. In some implementations, solder may include percentages of lead, copper, tin, and/or silver. The metal ball may include copper, for example, or any other appropriate electrically-conductive metal that melts at a higher temperature than the solder that is used. For example, the metal ball may be partly copper, pure copper, lead, tin, a combination of lead and tin—for example, 90% lead and 10% tin, or a pure copper core surrounded by other metal such as lead, tin, or a combination of lead and tin. In any case, all or part of the metal ball is configured to have a melting temperature that is greater than the melting temperature of the solder used. Accordingly, when the BGA is put through a solder reflow cycle while attaching to a printed circuit board, the solder melts while the metal ball remains unmelted in whole or in part.

The metal balls are also configured—for example, they have structures, compositions, or both structures and compositions—so that the metal balls do not collapse in whole or in part in response to an applied force at an elevated temperature. In some implementations, that temperature is between 130° Celsius (C) and 250° C. inclusive. However, that temperature may vary based on the type of solder used. As noted, the metal balls are configured to melt at a higher temperature than the solder and, therefore, the solder melts first during, for example, heat applied in a solder reflow cycle. The metal balls may be spherical in shape; however, other shapes may be used. For example, the metal balls may be cylinders, triangular prisms, rectangular prisms, pentagonal prisms, hexagonal prisms, polyhedrons, non-regular (irregular) three-dimensional shapes, or any other appropriate shapes. In some implementations, each of the metal balls is 0.3 millimeters (mm) in diameter or less than 0.3 mm in diameter; however, metal balls of other sizes may be used. In some implementations, each of the metal balls is on the order of tenths of millimeters in diameter, for example, 0.1 mm, 0.2 mm, 0.4 mm, 0.5 mm, 0.6 mm, 0.7 mm, 0.8 mm, or 0.9 mm in diameter.

In all or some electrical connections, the solder is part of the electrical connections between the substrate and the PCB and the solder is between at least some of the metal balls and conductive contacts on the circuit board and substrate. In some implementations, the solder includes Sn63Pb37 and at least some of the metal balls include a core comprised of Sn63 and coated with Pb37, where "Sn" refers to tin and "Pb" refers to lead. In these implementations, the metal balls are configured not to collapse below 215° C. for a given applied force, which is explained below. In some implementations, the solder includes SAC305 and the at least some of the metal balls include a core coated with SAC305, where "SAC" refers to a tin-silver-copper alloy. In these implementations, the metal balls are configured not to collapse below 240° C. for a given applied force. In some implementations, the solder includes Sn63Pb37 and at least some of the metal balls include Sn10Pb90. In these implementations, the metal balls are configured not to collapse below 215° C. for a given applied force. In some implementations, the solder includes Sn42Bi58 and at least some of the metal balls include SAC305, where "Bi" refer to bismuth. In these implementations, the metal balls are configured not to collapse below 138° C. for a given applied force. In some implementations, the solder includes Sn42Bi58 and at least some of the metal balls include Sn63Pb37. In these implementations, the metal balls are configured not to collapse below 138° for a given applied force. In some implementations, the solder includes OM550 and at least some of the metal balls include SAC305, where "OM" refers to a lead-free, zero-halogen solder paste. In these implementations, the metal balls are configured not to collapse below 200° C. for a given applied force. In some implementations, the solder includes Sn42Bi58 and at least some of the metal balls include SAC305. In these implementations, the metal balls are configured not to collapse below 141° C. for a given applied force.

Flattening fixture 16 of FIG. 1 is used to apply force to the substrate 12 and to distribute that force evenly across the top surface 18 of substrate 12. This force reduces the chances that substrate 12 will warp during heating, such as during a solder reflow cycle. As explained, heat can cause the substrate to warp. Warping of substrate 12 is shown in FIG. 1 at its edges. Therefore, flattening fixture 16 is configured to apply force to the substrate in the direction of arrows 20 during heating in order to keep the substrate flat or substantially flat during heating. For example, weights 22 or a mechanical structure may cause application of the force.

The applied force can, in some cases, affect the shape of the metal balls since the force is transferred to the metal balls through the substrate. However, the metal balls, as described above, are configured not to collapse at least in part in response to this force and the applied heat. In some implementations, partial collapsing is acceptable so long as the amount of collapsing does not cause contact between adjacent metal balls. In this regard, fully collapsed metal balls can result in contact between adjacent metal balls and, therefore, shorting of electrical contacts on the substrate. This can be particularly problematic when electrical contacts are at fine pitches. In some examples, a pitch defines the distance between the centers of two adjacent electrical contacts on the substrate. In some implementations, the pitches of electrical contacts on substrate 12 are 100 microns (µ) or less and the pitches of electrical contacts on PCB 11 are 500µ or less. As noted, substrate 12 acts as an interposer that translates the pitch of the electrical connections on PCB 11 to the pitch of electrical connections on substrate 12. Notably, however, the system described herein is not limited to these pitches and may be used with any appropriate pitch values.

In some implementations, sufficient force is applied to maintain a level of flatness in a range of two mils (thousandths of an inch) (50.8 µm) to eight mils (203.2 µm); however, the system is not limited to maintaining levels of flatness within this range. In some cases, flatness of the substrate is measured from a maximum peak (or height) to a maximum valley (or depth) of a surface of substrate 12. Flatness may be measured as a maximum deviation of no more than a certain value (such as two mils, three mils (76.2 µm), four mils (101.6 µm), five mils (127 µm), six mils (152.4 µm), and so forth) in one direction relative to a plane and in the opposite direction relative to the same plane. Measurements of the flatness of substrate 12 may be taken at surface 18, at surface 24, or at both surfaces 18 and 24. Keeping both surfaces 18 and 24 sufficiently flat may improve electrical connections to electrical contacts on those surfaces. For example, when a surface is not sufficiently flat—for instance, the surface is warped due to heating—electrical connections on that surface may be difficult to make. That is, if one surface of a first board is not sufficiently flat, electrical contacts on that surface and/or on an adjacent surface on a second board may not connect to the BGA. As a result, all electrical connections between the board and the second board may not be made. This is particularly true at board edges as shown in FIG. 1, where warping can cause at least some contacts on substrate 12 to pull away from the BGA or cause at least some of the BGA to pull away from the PCB along with the substrate.

In some implementations, an example substrate 12 when soldered was found to have an average warp at its outer edges of 90µ absent the presence of force by flattening fixture 16. Based on the Roark and Young Formula for Stress and Strain on a simply supported rectangular plate on four sides, a seven Newton (N) load was applied to flatten a warp at the outer edges of substrate 12 by 40 µm. For different substrate sizes, the deflection of plate models in the Roark and Young Formula for Stress and Strain, for example, can be used to determine the amount of force needed to achieve a particular flatness objective vis-à-vis manufacturability requirements. Although a seven Newton force is described, any appropriate force may be used. For example, the force applied by flattening fixture 16 may be one Newton, two Newtons, three Newtons, four Newtons, five Newtons, six Newtons, eight Newtons, nine Newtons, ten Newtons, and so forth. As noted, these forces may be applied at temperatures between 130° C. and 250° C. Depending upon the size, shape, and composition of the metal balls in the BGA, the force may be applied at temperatures less than 130° C. or greater than 250° C.

In some implementations, BGA 14 is a very large BGA. In some implementations, a very large BGA includes 3000 or more electrical connections comprised of metal balls and solder, 5000 or more electrical connections comprised of metal balls and solder, 10,000 or more electrical connections comprised of metal balls and solder, 15,000 or more electrical connections comprised of metal balls and solder, 20,000 or more electrical connections comprised of metal balls and solder, 25,000 or more electrical connections comprised of metal balls and solder, 30,000 or more electrical connections comprised of metal balls and solder, 35,000 or more electrical connections comprised of metal balls and solder, or 40,000 or more electrical connections comprised of metal balls and solder. Notably, however, the system described herein is not limited to use with any particular size BGA.

In some implementations, flattening fixture 16 may be made of FR4, composite, metal, or other appropriate material that does not melt during a heating cycle, for example, during heating to a temperature between 130° C. and 250° C. The surface of the flattening fixture that contacts the substrate is itself also flat. For example, in some implementations, the flattening fixture surface has a level of flatness in a range of two mils (50.8 µm) to eight mils (203.2 µm); however, the system is not limited to use with flattening fixtures having levels of flatness within this range. In some cases, flatness of the flattening fixture surface is measured from a maximum peak (or height) to a maximum valley (or depth) of the surface. Flatness may be measured as a maximum deviation of no more than a certain value (such as two mils, three mils (76.2 µm), four mils (101.6 µm), five mils (127 µm), six mils (152.4 µm), and so forth) in one direction relative to a plane and in the opposite direction relative to the same plane. In some implementations, the flattening fixture may be reinforced structurally with internal structures 17 (as shown in FIG. 2B) such as ribs configured in a hub-and-spoke pattern, configured as concentric circles, or configured in a grid pattern, for example. These internal structures may aid in distributing force across the surface of the flattening fixture in contact with the substrate.

Figure 2:
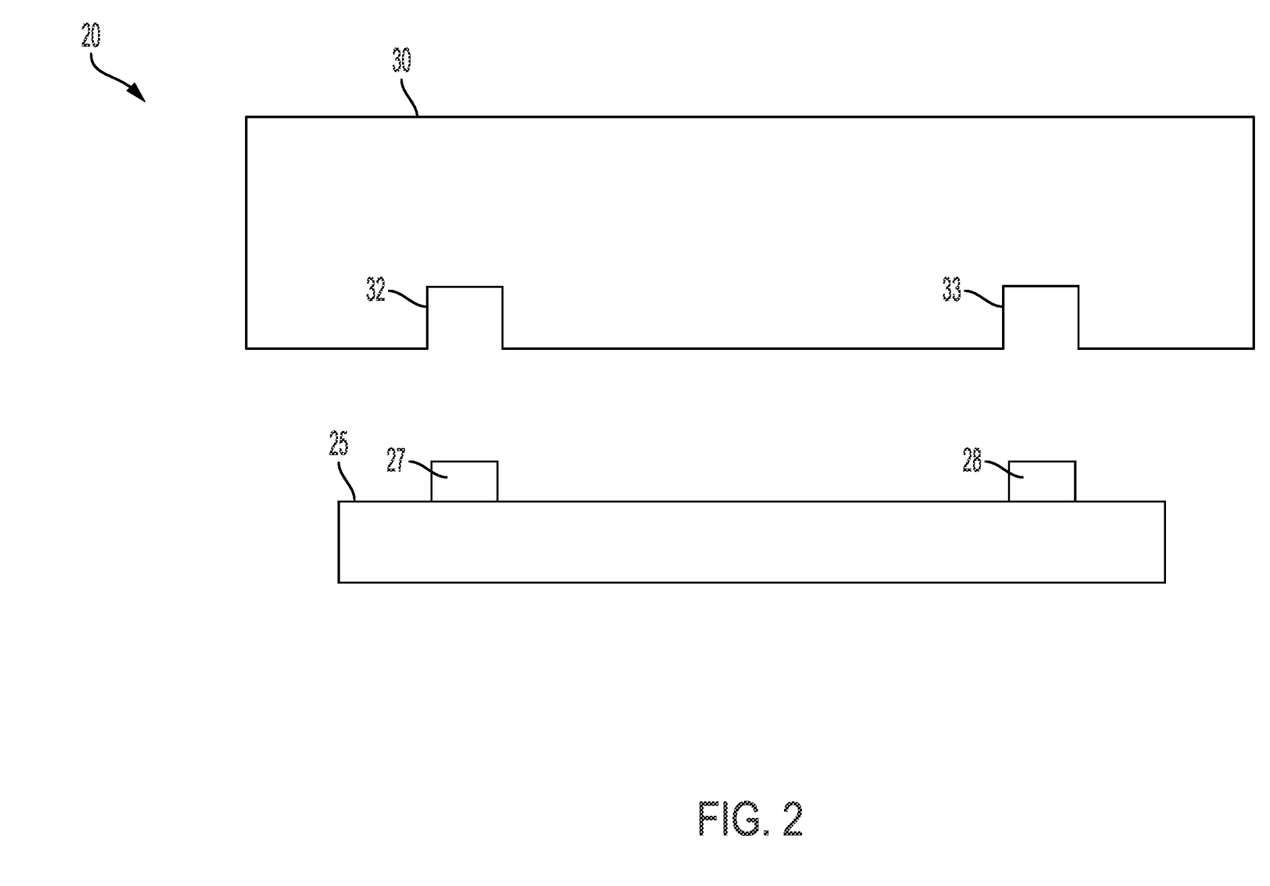
FIG. 2 is a side view of a block diagram of a surface of a substrate containing components and complementary indentations on an example flattening fixture.

In some implementations, there may be one or more electrical components on the surface of a substrate that contacts the flattening fixture. In these cases, the flattening fixture may include indentations that complement that shapes of the components so as not to apply undue or any force and damage the components. Referring to FIG. 2, for example, if a substrate surface 25 includes components 27 and 28, flattening fixture 30 may include complementary indentations 32 and 33 at the locations where the flattening fixture corresponds to those components. The indentations may be of sufficient depth so as not to contact the components during application of force. In implementations where the substrate includes components, the flatness of the substrate may be determined based on areas that do not have the components. That is, the components are not considered a peak or a valley in the substrate when measuring the flatness of the substrate.

In some implementations, the substrate has a surface area of three square inches ($in^2$) (6.45 square centimeters ($cm^2$)) or more. However, the system described herein is not limited to use with substrates of any particular surface area.

Figure 3:
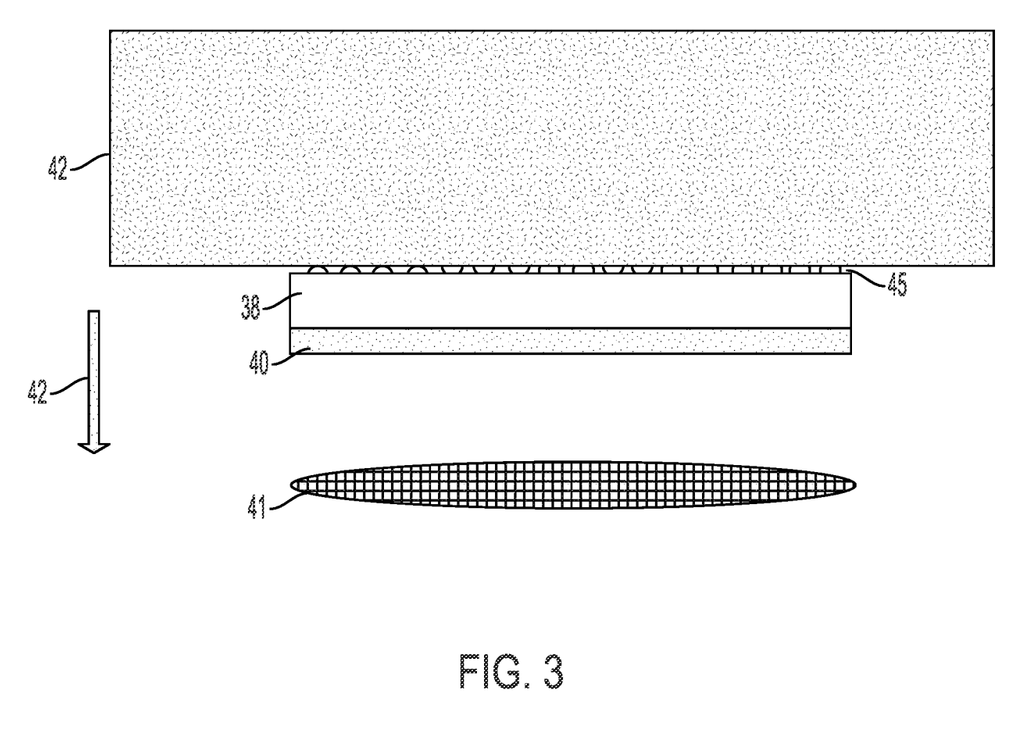
FIG. 3 is a side view of a block diagram of components of a test head including a printed circuit board, an interposer board, and a probe card.
Figure 4:
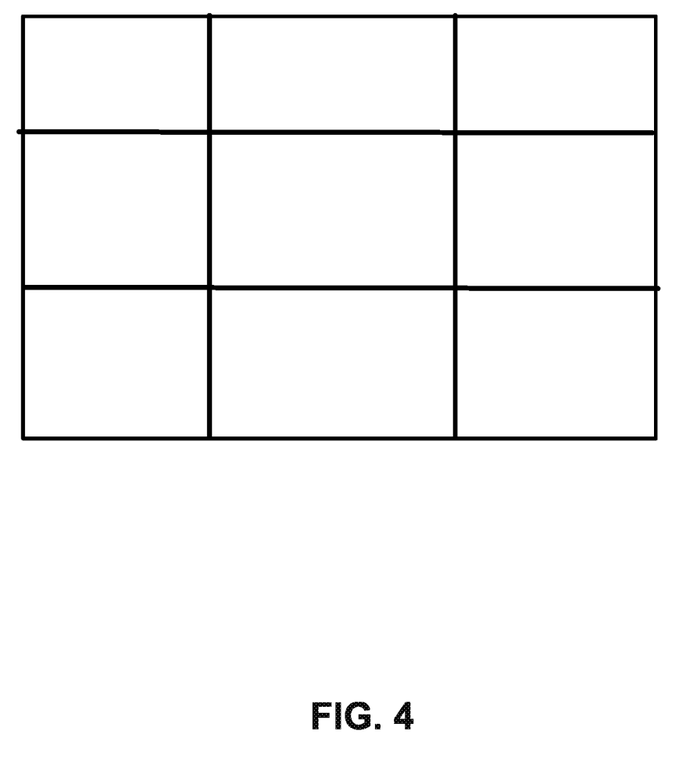
FIG. 4 shows a top view of an example flattening fixture reinforced structurally with internal structures comprising ribs configured in a hub-and-spoke pattern.

Referring to FIG. 3, in a test head of a test system, a substrate 38 is configured to connect electrically to a probe card 40. The probe card is configured to perform testing on dice on a wafer 41 by coming into contact with the wafer through motion of the test head in the direction of arrow 42. As explained previously, in this example substrate 38 is an interposer board that is configured to translate electrical contacts at a first pitch on the probe card to electrical contacts at a second, different pitch on PCB 42, which includes test electronics. Typically, the pitch of the electrical contacts on the probe card is finer than the pitch of the electrical contact on PCB 42; however, that need not be the case. In some implementations, the pitch of the electrical contacts on the PCB may be finer than the pitch of the electrical contacts on the probe card. In some implementations, the pitch of the electrical contacts on probe card 40 and on PCB 42 may be the same, in which case the substrate is not used to change the pitch. As shown in FIG. 3, the substrate and the PCB are connected electrically using a BGA 45 of the type described herein. Warping is prevented during solder reflow to implement the electrical connection by using a flattening fixture and the process described with respect to FIG. 1.

The example systems are described in the context of maintaining the shape of a circuit board during heating. However, the example systems may be employed to maintain the shape of the circuit board in response to other types of environmental stress. For example, the systems may be used to maintain the shape of circuit boards in the presence of excessive humidity, cold, or physical force.

The example system and ATE described herein may be implemented and/or controlled using one or more computer systems comprising hardware or a combination of hardware and software. For example, an ATE like the one described herein may include various test controllers and/or processing devices located at various points in the system to control operation of the automated elements, including components to apply force to the substrate via the flattening fixture. A central computer may coordinate operation among the various test controllers or processing devices. The central computer, test controllers, and processing devices may execute various software routines to effect control and coordination of the various automated elements.

The example system and ATE described herein can be implemented and/or controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one test site or distributed across multiple test sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Each computing device may include a hard drive for storing data and computer programs, and a processing device (e.g., a microprocessor) and memory (e.g., RAM) for executing computer programs. Each computing device may include an image capture device, such as a still camera or video camera. The image capture device may be built-in or simply accessible to the computing device and may be used to capture images of, and to control operations of, robotics included in the test system, such as robotics used to control force applied using the flattening fixture.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A system comprising:
   metal balls that are configured not to collapse in whole or part in response to a force below a predefined force and a temperature below a predefined temperature, the metal balls being configured to support a substrate, the metal balls being part of electrical connections between the substrate and a circuit board; and
   a fixture having a size that enables application of force to an entire a surface of the substrate at once while the substrate is subjected to the temperature, the fixture being configured to distribute the force across a flat surface of the fixture in contact with the surface of the substrate that is not in contact with the metal balls such that the force applied by the fixture and the support of the substrate by the metal balls maintains a shape of the substrate at the temperature;
   wherein the substrate comprises one or more components on a surface of the substrate; and
   wherein the fixture comprises indentations that complement shapes of the one or more components but that do not produce contact between the fixture and the one or more components.

2. The system of claim 1, wherein the predefined force comprises seven Newtons or greater.

3. The system of claim 1, wherein the predefined temperature comprises a temperature between 130° Celsius (C) and 250° C.

4. The system of claim 1, wherein the metal balls comprises copper.

5. The system of claim 4, wherein the metal balls are pure copper.

6. The system of claim 4, wherein the metal balls comprise a core that is pure copper.

7. The system of claim 1, wherein the metal balls comprise lead and tin.

8. The system of claim 7, wherein the metal balls comprise 90% lead and 10% tin.

9. The system of claim 1, further comprising:
   solder between at least some of the metal balls and conductive contacts on the circuit board, the solder being part of the electrical connections between the substrate and a circuit board.

10. The system of claim 1, wherein the substrate comprises an interposer configured to translate a first pitch of contacts to a second pitch of contacts, the second pitch being greater than the first pitch.

11. The system of claim 1, wherein there are between 3000 metal balls and 10,000 metal balls.

12. The system of claim 1, wherein there are 20,000 or more metal balls.

13. The system of claim 1, wherein there are 30,000 or more metal balls.

14. The system of claim 1, wherein each of the metal balls is on the order of tenths of a millimeter in diameter.

15. The system of claim 1, wherein each of the metal balls is 0.3 millimeters in diameter or less than 0.3 millimeters in diameter.

16. The system of claim 1, wherein the substrate is flat in shape.

17. The system of claim 1, wherein the substrate is flat in shape; and
    wherein flatness comprises a maximum deviation of no more than .0508 millimeters (²⁄₁₀₀₀ inches) in a first direction relative to a plane and in a second direction relative to the plane, the first direction being different than the second direction.

18. The system of claim 1, wherein the substrate is flat in shape; and
    wherein flatness comprises a maximum deviation of no more than .0762 millimeters (³⁄₁₀₀₀ inches) in a first direction relative to a plane and in a second direction relative to the plane, the first direction being different than the second direction.

19. The system of claim 1, wherein the substrate comprises an interposer; and
    wherein the substrate is configured to connect electrically to a probe card configured to perform testing on dice on a wafer.

20. The system of claim 19, wherein the interposer is configured to translate contacts at a first pitch on the probe card to contacts at a second pitch on the circuit board, the second pitch being greater than the first pitch.

21. The system of claim 1, wherein the metal balls are configured not to collapse at all in response to the force below the predefined force and the temperature below the predefined temperature.

22. The system of claim 1, further comprising:
    solder between at least some of the metal balls and conductive contacts on the circuit board, the solder being part of the electrical connections between the substrate and a circuit board;
    wherein the solder comprises Sn63Pb37 and the at least some of the metal balls comprise a core comprised of Sn63 and coated with Pb37; and
    wherein the predefined temperature is 215° Celsius.

23. The system of claim 1, further comprising:
    solder between at least some of the metal balls and conductive contacts on the circuit board, the solder being part of the electrical connections between the substrate and a circuit board;
    wherein the solder comprises SAC305 and the at least some of the metal balls comprise a core coated with SAC305; and
    wherein the predefined temperature is 240° Celsius.

24. The system of claim 1, further comprising:
    solder between at least some of the metal balls and conductive contacts on the circuit board, the solder being part of the electrical connections between the substrate and a circuit board;
    wherein the solder comprises Sn63Pb37 and the at least some of the metal balls comprise Sn10Pb90; and
    wherein the predefined temperature is 215° Celsius.

25. The system of claim 1, further comprising:
    solder between at least some of the metal balls and conductive contacts on the circuit board, the solder being part of the electrical connections between the substrate and a circuit board;

wherein the solder comprises Sn42Bi58 and the at least some of the metal balls comprise SAC305; and wherein the predefined temperature is 138° Celsius.

26. The system of claim 1, further comprising:

solder between at least some of the metal balls and conductive contacts on the circuit board, the solder being part of the electrical connections between the substrate and a circuit board;

wherein the solder comprises Sn42Bi58 and the at least some of the metal balls comprise Sn63Pb37; and wherein the predefined temperature is 138° Celsius.

27. The system of claim 1, further comprising:

solder between at least some of the metal balls and conductive contacts on the circuit board, the solder being part of the electrical connections between the substrate and a circuit board;

wherein the solder comprises OM550 and the at least some of the metal balls comprise SAC305; and wherein the predefined temperature is 200° Celsius.

28. The system of claim 1, further comprising:

solder between at least some of the metal balls and conductive contacts on the circuit board, the solder being part of the electrical connections between the substrate and a circuit board;

wherein the solder comprises Sn42Bi58 and the at least some of the metal balls comprise SAC305; and wherein the predefined temperature is 141° Celsius.

* * * * *